US010698852B2

(12) United States Patent
Kim et al.

(10) Patent No.: US 10,698,852 B2
(45) Date of Patent: Jun. 30, 2020

(54) TERMINATION CIRCUIT AND INTERFACE DEVICE

(71) Applicant: SAMSUNG ELECTRONICS CO., LTD., Suwon-si (KR)

(72) Inventors: Tae Jin Kim, Hwaseong-si (KR); Hyun Wook Lim, Seoul (KR); Seong Young Ryu, Seoul (KR); Soo Joo Lee, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 42 days.

(21) Appl. No.: 15/941,607

(22) Filed: Mar. 30, 2018

(65) Prior Publication Data

US 2019/0087373 A1   Mar. 21, 2019

(30) Foreign Application Priority Data

Sep. 21, 2017   (KR) .................... 10-2017-0121670

(51) Int. Cl.
  *G06F 13/40*    (2006.01)
  *H03K 19/0175*  (2006.01)
  *G09G 3/20*     (2006.01)
  *G09G 5/00*     (2006.01)

(52) U.S. Cl.
  CPC ...... *G06F 13/4022* (2013.01); *G06F 13/4068* (2013.01); *G09G 3/20* (2013.01); *H03K 19/017509* (2013.01); *H03K 19/017545* (2013.01); *G09G 5/006* (2013.01); *G09G 2370/08* (2013.01); *G09G 2370/14* (2013.01)

(58) Field of Classification Search
  CPC ............ G06F 13/4022; G06F 13/4068; H03K 19/017509; H03K 19/017545
  USPC ................. 710/10, 14, 31, 38, 51, 107, 316
  See application file for complete search history.

(56) References Cited

U.S. PATENT DOCUMENTS

| 6,941,402 B2 | 9/2005 | Tashiro | |
| 8,299,837 B1* | 10/2012 | Lin | .......................... H03F 3/005 327/337 |
| 8,390,604 B2 | 3/2013 | Ryu | |

(Continued)

FOREIGN PATENT DOCUMENTS

JP   2013118566 A   6/2013

*Primary Examiner* — Farley Abad
*Assistant Examiner* — Henry W Yu
(74) *Attorney, Agent, or Firm* — Sughrue Mion, PLLC

(57) ABSTRACT

A termination circuit is provided. The termination device includes terminals configured to receive a corresponding signal; unit circuits respectively connected to the terminals, the unit circuits each including a unit resistor and a unit switch element connected to each other in series; common mode capacitors; first switch elements respectively connected between each of the unit circuits and a first corresponding common mode capacitor of common mode capacitors, each of the first switch elements being configured to turn on when the corresponding signal is received in a first mode; and second switch elements respectively connected between each of the unit circuits and a second corresponding common mode capacitor of the common mode capacitors, the second switch elements being configured to turn on when the corresponding signal is received in a second mode different from the first mode.

20 Claims, 15 Drawing Sheets

(56) References Cited

U.S. PATENT DOCUMENTS

| | | | | |
|---|---|---|---|---|
| 8,723,583 | B2* | 5/2014 | Wu | H04L 25/0272 |
| | | | | 326/30 |
| 8,866,529 | B2* | 10/2014 | Wu | G05F 3/08 |
| | | | | 327/320 |
| 8,907,703 | B1* | 12/2014 | Trampitsch | G11C 27/024 |
| | | | | 327/91 |
| 9,054,916 | B1 | 6/2015 | Nguyen | |
| 2006/0055436 | A1* | 3/2006 | Gaboriau | H03M 1/08 |
| | | | | 327/94 |
| 2006/0114049 | A1* | 6/2006 | Josefsson | H03H 19/004 |
| | | | | 327/337 |
| 2009/0072800 | A1* | 3/2009 | Ramadass | H02M 3/07 |
| | | | | 323/271 |
| 2013/0285667 | A1* | 10/2013 | Koduka | G01R 19/0084 |
| | | | | 324/433 |
| 2015/0108955 | A1* | 4/2015 | Yeo | G01R 27/2605 |
| | | | | 323/271 |
| 2015/0381340 | A1 | 12/2015 | Pandey et al. | |
| 2016/0226734 | A1 | 8/2016 | Pandey et al. | |
| 2016/0380755 | A1 | 12/2016 | Sengoku | |
| 2017/0032757 | A1* | 2/2017 | Itoigawa | H03L 7/00 |
| 2017/0039163 | A1 | 2/2017 | Sejpal et al. | |
| 2017/0255250 | A1* | 9/2017 | Ngo | G06F 1/3287 |

\* cited by examiner

TERMINATION CIRCUIT AND INTERFACE DEVICE

CROSS-REFERENCE TO RELATED APPLICATION

This application claims priority from Korean Patent Application No. 10-2017-0121670, filed on Sep. 21, 2017 in the Korean Intellectual Property Office, the disclosure of which is incorporated herein by reference in its entirety.

BACKGROUND

1. Field

Methods and apparatuses consistent with example embodiments relate to a termination circuit and an interface device.

2. Related Art

Integrated circuits (ICs) included in electronic devices may communicate with one another through interface devices. As the capacity of data processed by electronic devices increases, various communication standards to provide high-speed data communication between ICs have been proposed. At the same time, for the purpose of supporting impedance matching for accurate communication between ICs, termination circuits are needed in interface devices that receive data. According to data communication standards, termination circuits may have different structures.

SUMMARY

One or more example embodiments provide a termination circuit and an interface device that may efficiently process data transmitted according to different communication standards.

According to an aspect of an example embodiment, there is provided a termination circuit including: a plurality of terminals, each of the plurality of terminals being configured to receive a corresponding signal; a plurality of unit circuits respectively connected to the plurality of terminals, the plurality of unit circuits each including a unit resistor and a unit switch element connected to each other in series; a plurality of common mode capacitors; a plurality of first switch elements respectively connected between each of the plurality of unit circuits and a first corresponding common mode capacitor of the plurality of common mode capacitors, each of the plurality of first switch elements being configured to turn on when the corresponding signal is received in a first mode; and a plurality of second switch elements respectively connected between each of the plurality of unit circuits and a second corresponding common mode capacitor of the plurality of common mode capacitors, the plurality of second switch elements being configured to turn on when the corresponding signal is received in a second mode different from the first mode.

According to an aspect of another example embodiment, there is provided a termination circuit including: a plurality of unit circuits having input terminals respectively connected to a plurality of terminals; a plurality of common mode capacitors respectively connected between a plurality of common nodes and a ground; and a switch unit including a plurality of switch pairs which respectively connect output terminals of the plurality of unit circuits to corresponding common nodes of the plurality of common nodes, each of the plurality of switch pairs including a first switch element and a second switch element, the first switch element and the second switch element included in at least one among the plurality of switch pairs corresponding to different common nodes.

According to an aspect of yet another example embodiment, there is provided an interface device including: a plurality of receivers respectively configured to generate data corresponding to a signal which is input to a corresponding terminal of a plurality of terminals; a plurality of unit circuits each including a unit resistor and a unit switch element connected to each other in series, the plurality of unit circuits being respectively connected to the plurality of terminals; a plurality of common mode capacitors respectively connected to the plurality of unit circuits through corresponding first switch elements of a plurality of first switch elements and corresponding second switch elements of a plurality of second switch elements; and a controller configured to turn the plurality of first switch elements on in response to the signal being received in a first mode and turn the plurality of second switch elements on in response to the signal being received in a second mode.

BRIEF DESCRIPTION OF DRAWINGS

The above, and other aspects, features, and advantages will be more clearly understood from the following detailed description taken in conjunction with the accompanying drawings, in which.

DETAILED DESCRIPTION

Hereinafter, example embodiments will be described with reference to the accompanying drawings.

Figure 1:
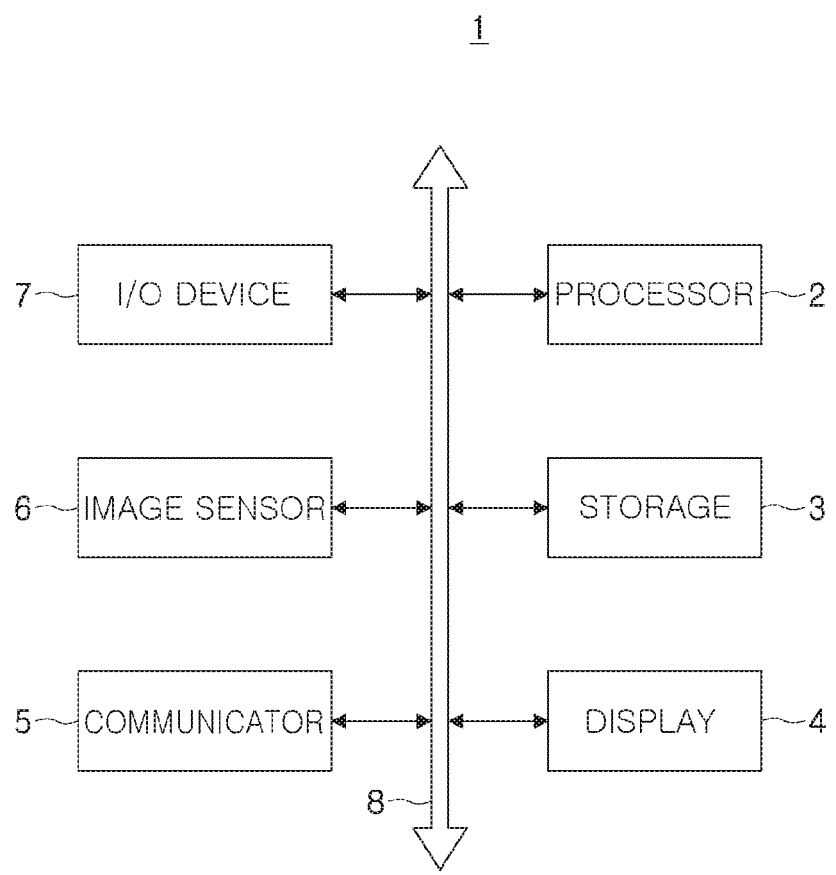
FIG. 1 is a block diagram schematically illustrating an electronic device, according to an example embodiment.

FIG. 1 is a block diagram schematically illustrating an electronic device, according to an example embodiment.

Referring to FIG. 1, an electronic device 1, according to an example embodiment, may include a processor 2, a storage 3, a display 4, a communicator 5, an image sensor 6, and an input/output (I/O) device 7. The electronic device 1 may include a television and a desktop personal computer (PC), in addition to a mobile device, such as a smartphone, a tablet PC, or a laptop PC. Components, such as the processor 2, the storage 3, the display 4, the communicator 5, the image sensor 6, the I/O device 7, or the like, may communicate with each other through a bus 8.

The entirety of operations of the electronic device 1 may be controlled by the processor 2. The processor 2 may be known by various names, according to types of the electronic device 1. As an example, when the electronic device 1 is a tablet PC or smartphone, the processor 2 may be an application processor (AP), and when the electronic device 1 is a laptop PC or desktop PC, the processor 2 may be a central processing unit (CPU). The storage 3 may be a device that may store data, and may include a flash memory, a dynamic random access memory (DRAM), a static random access memory (SRAM), and a cache memory. The display 4 may be a device to output an image, and may be provided as a liquid crystal display (LCD), an organic light-emitting diode (OLED) display, an electronic paper display, or a microelectromechanical systems (MEMS) display.

The communicator 5 may be a transceiver (transmitter and receiver) that relays communication between the electronic device 1 and further external electronic devices. The communicator 5 may communicate data with the further external electronic devices through various communication interfaces, for example, a wired communication interface, such as universal serial bus (USB), local area network (LAN), micro-USB, or the like, or a wireless communication interface, such as Wi-Fi, Bluetooth, near field communication (NFC), infrared communication, visible light communication, or the like. The image sensor 6 may be a device to capture an image, and may include a complementary metal-oxide semiconductor (CMOS) image sensor or a charge-coupled device (CCD). The I/O device 7 may include devices to receive an instruction from an external source or to output audio, vibrations, or the like. According to an example embodiment, the I/O device 7 may include components, such as an audio output interface, a touchscreen, a mechanical key, and the like.

The respective components 2 to 7 included in the electronic device 1 may communicate with one another via the bus 8. The respective components 2 to 7 included in the electronic device 1 may communicate data with one another according to various communication standards. According to an example embodiment, when the electronic device 1 is a mobile device, the respective components 2 to 7 may communicate data with one another according to communication standards defined by mobile industry processor interface (MIPI) standards.

According to MIPI standards, different communication standards having different physical layers may be defined. Thus, according to types of the electronic device 1, communication standards applied to data communication between the respective components 2 to 7 may be different from each other, and a need for an interface device that may support two or more communication standards has increased.

Figure 2:
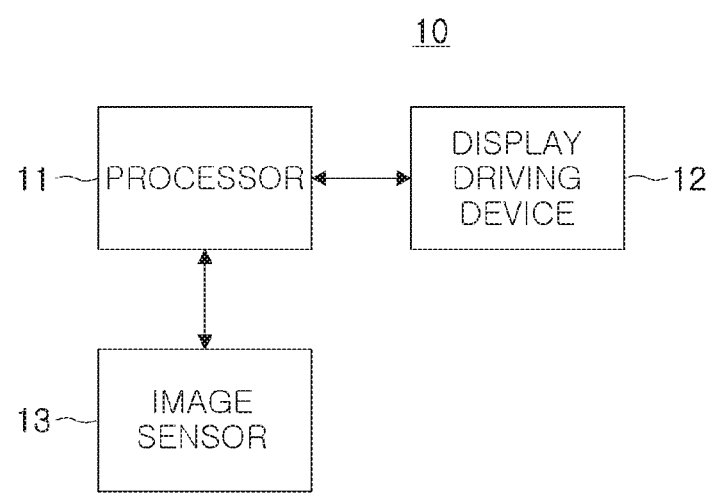
FIGS. 2 through 4 are block diagrams illustrating data communication of an electronic device, according to an example embodiment.
Figure 3:
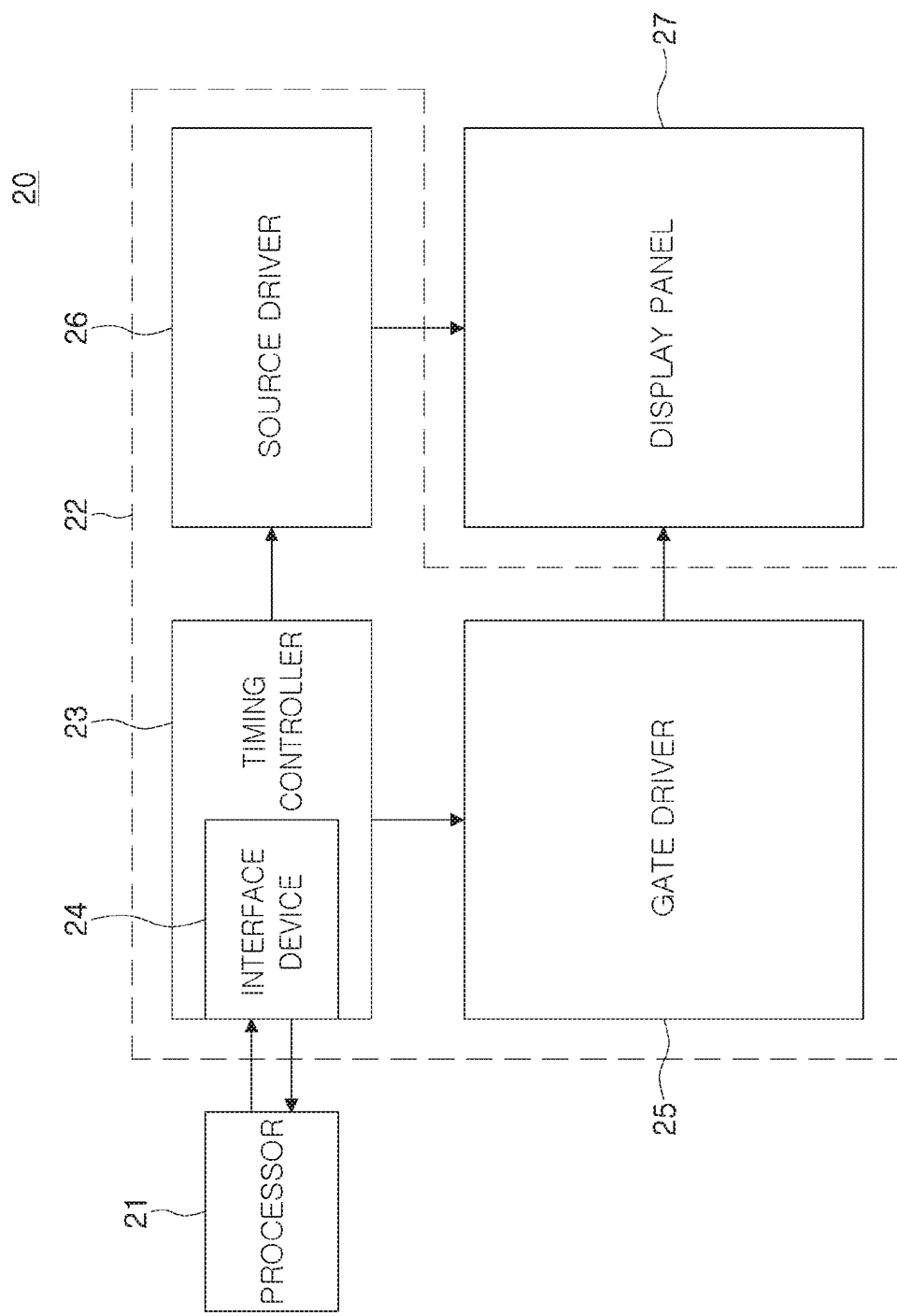
Figure 4:
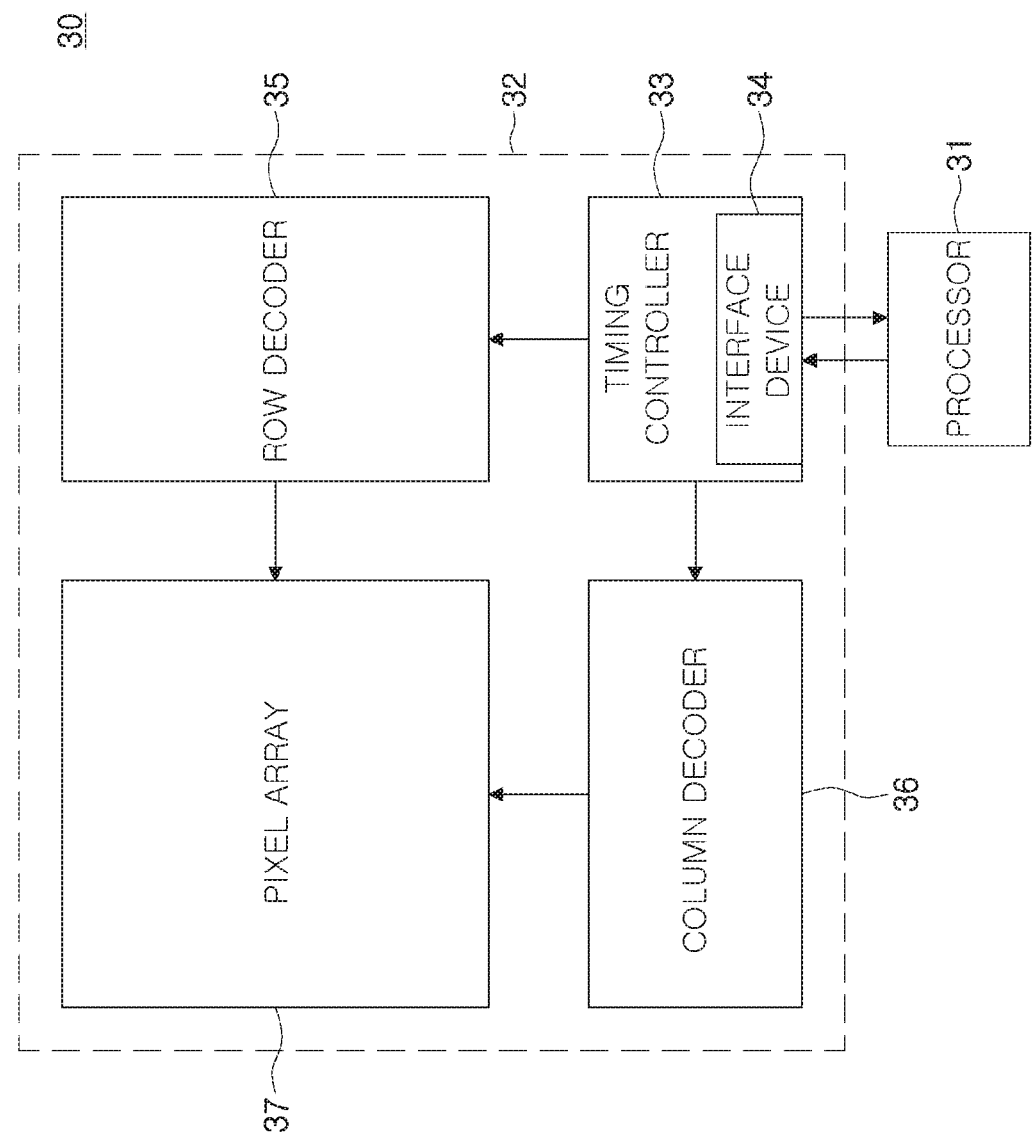

FIGS. 2 through 4 are block diagrams illustrating data communication of an electronic device, according to an example embodiment.

Referring to FIG. 2, an electronic device 10, according to an example embodiment, may include integrated circuit (IC) devices, such as a processor 11, a display driving device 12, an image sensor 13, or the like. The processor 11 may be an AP, a CPU, or the like, controlling the entirety of operations of the electronic device 10. The processor 11 may transmit image data to the display driving device 12, or may receive image data generated by the image sensor 13. According to an example embodiment, communication standards applied to communication between the processor 11 and the display driving device 12 may be different from those applied to communication between the processor 11 and the image sensor 13.

According to an example embodiment, the processor 11, the display driving device 12, and the image sensor 13 may communicate data with one another using any one of differential signaling using two lines, and multilevel signaling using three lines. The differential signaling may be advantageous in high-speed data communications, in which a clock signal may be transmitted separately through a line different from that for transmitting general data. The multilevel signaling may be advantageous in terms of effective data transfer rate, in which a clock signal is not transmitted separately. Thus, for the multilevel signaling, a clock recovery device may be provided at a receiving end.

Each of the processor 11, the display driving device 12, and the image sensor 13 may include an interface device that may communicate data, using differential signaling or multilevel signaling. The interface device may support impedance matching, and may generate data based on a signal transmitted through a transmission line, using the differential signaling or the multilevel signaling.

FIG. 3 is a block diagram illustrating data communication between a processor 21 and a display driving device 22. Referring to FIG. 3, the display driving device 22 may include a timing controller 23, a gate driver 25, and a source driver 26. The timing controller 23 may control operations of the gate driver 25 and the source driver 26 to display an image on a display panel 27.

The timing controller 23 may include an interface device 24, relaying communication with the processor 21. According to an example embodiment, when an electronic device 20 is a mobile device, the interface device 24 may communicate data with the processor 21, according to communication standards defined by MIPI standards. As an example, the interface device 24 may support communication through at least one among a D-Phy interface and a C-Phy interface, as defined by MIPI standards.

FIG. 4 is a block diagram illustrating data communication between a processor 31 and an image sensor 32. Referring to FIG. 4, the image sensor 32 may include a timing controller 33, a row decoder 35, a column decoder 36, and a pixel array 37. The timing controller 33 may control operations of the row decoder 35 and the column decoder 36 to generate image data based on electric charges generated by the pixel array 37.

The timing controller 33 may include an interface device 34, relaying communication with the processor 31, and the interface device 34 may communicate data with the processor 31, according to communication standards defined by MIPI standards. As an example, the interface device 34 may support communication through at least one among a D-Phy interface and a C-Phy interface defined by MIPI standards.

Figure 5:
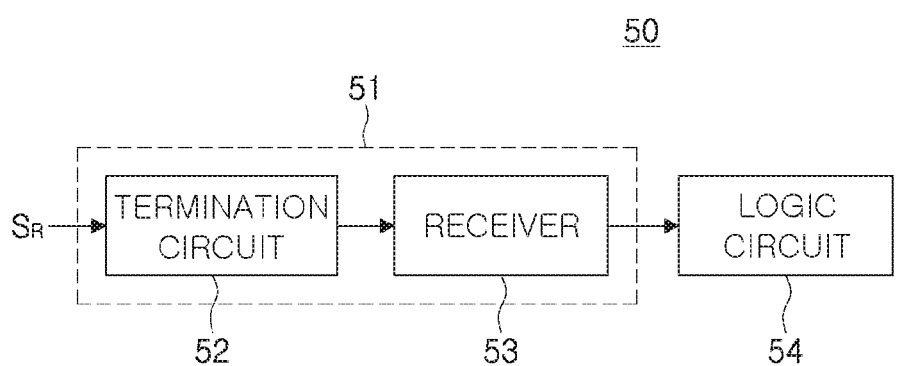
FIG. 5 is a block diagram schematically illustrating an integrated circuit (IC) device, according to an example embodiment.

FIG. 5 is a block diagram schematically illustrating an IC device, according to an example embodiment.

Referring to FIG. 5, an IC device 50, according to an example embodiment, may include an interface circuit 51 and a logic circuit 54. The interface circuit 51 may perform impedance matching for a received signal SR input to the IC device 50, and may generate data based on the received signal SR. The logic circuit 54 may process data output by the interface circuit 51.

According to an example embodiment, when the IC device 50 is a display driving device, the interface circuit 51 may receive a received signal SR, including image data, from a processor or the like, through a display series interface (DSI). The interface circuit 51 may generate image data based on the received signal SR, and may transmit the image data to the logic circuit 54. According to an example embodiment, the logic circuit 54 may include a timing controller, a gate driver, and a source driver of a display driving device, and may output the image data to a display panel to generate an image.

The interface circuit 51 may include a termination circuit 52 and a receiver 53. According to an example embodiment, the termination circuit 52 may include unit circuits connected to a transmission line for the received signal SR, and each of the unit circuits may include a unit resistor and a unit switch element connected to each other in series. According to an example embodiment, the sum of turn-on resistance values of the unit switch element and the unit resistor may be 50 ohm ($\Omega$).

The interface circuit 51 may process the received signal SR using differential signaling or multilevel signaling to generate data based on the received signal SR. According to an example embodiment, when the IC device 50 receives the received signal SR, according to MIPI standards, the differential signaling may be defined as a D-Phy interface, and the multilevel signaling may be defined as a C-Phy interface.

Termination methods applied to the differential signaling and the multilevel signaling may be different. For example, the termination method applied to the differential signaling, may not be suitable to be used in multilevel signaling-type impedance matching. Similarly, the termination method applied to the multilevel signaling, may not be suitable to be used in differential signaling-type impedance matching. The termination circuit 52, according to an example embodiment, may process the received signal SR, transmitted according to different communication standards, in a single interface circuit 51, by supporting both the differential signaling-type impedance matching and the multilevel signaling-type impedance matching.

Figure 6:
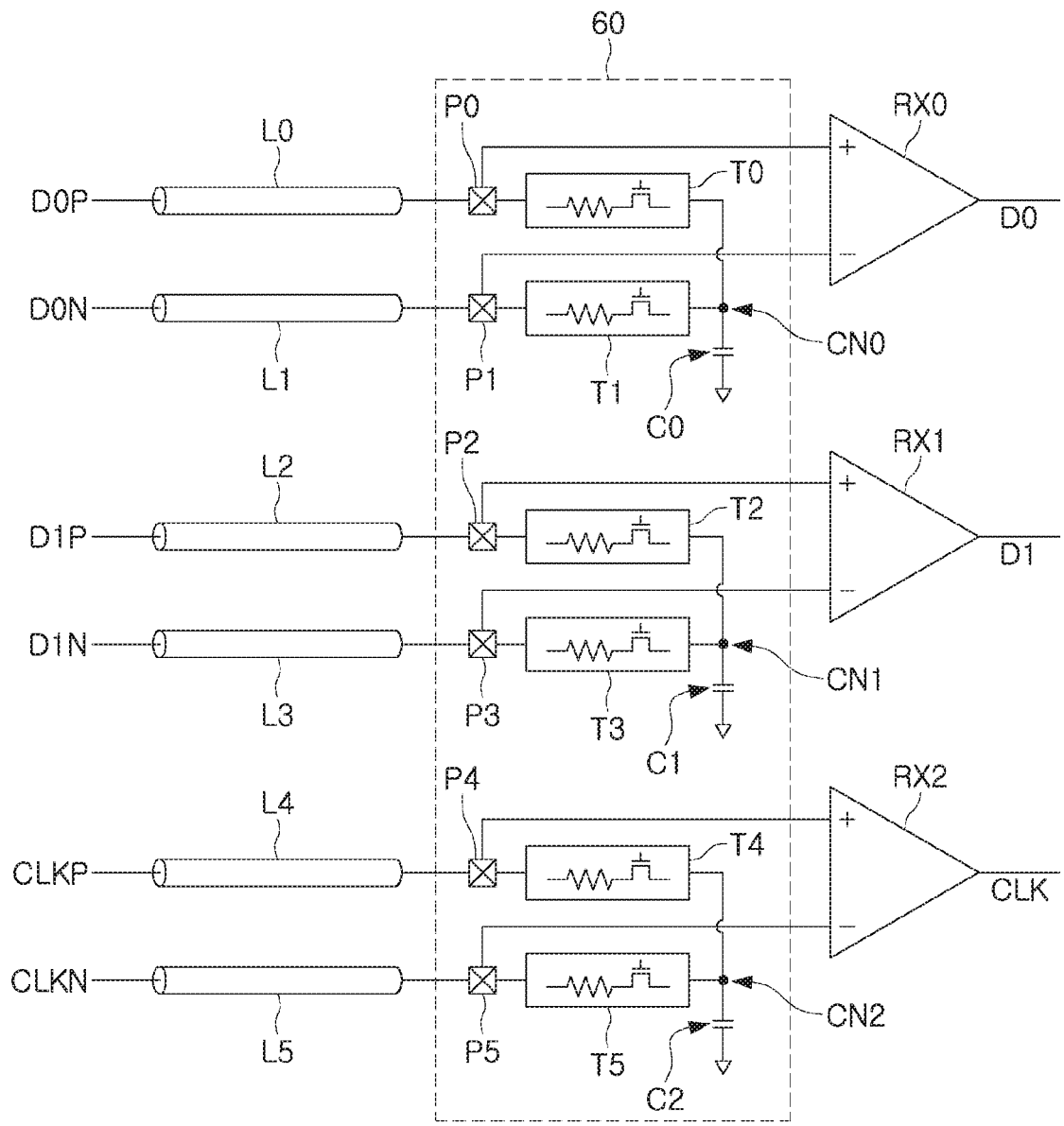
FIGS. 6 through 8 are comparative examples of circuit diagrams illustrating an interface device, according to an example embodiment.
Figure 7:
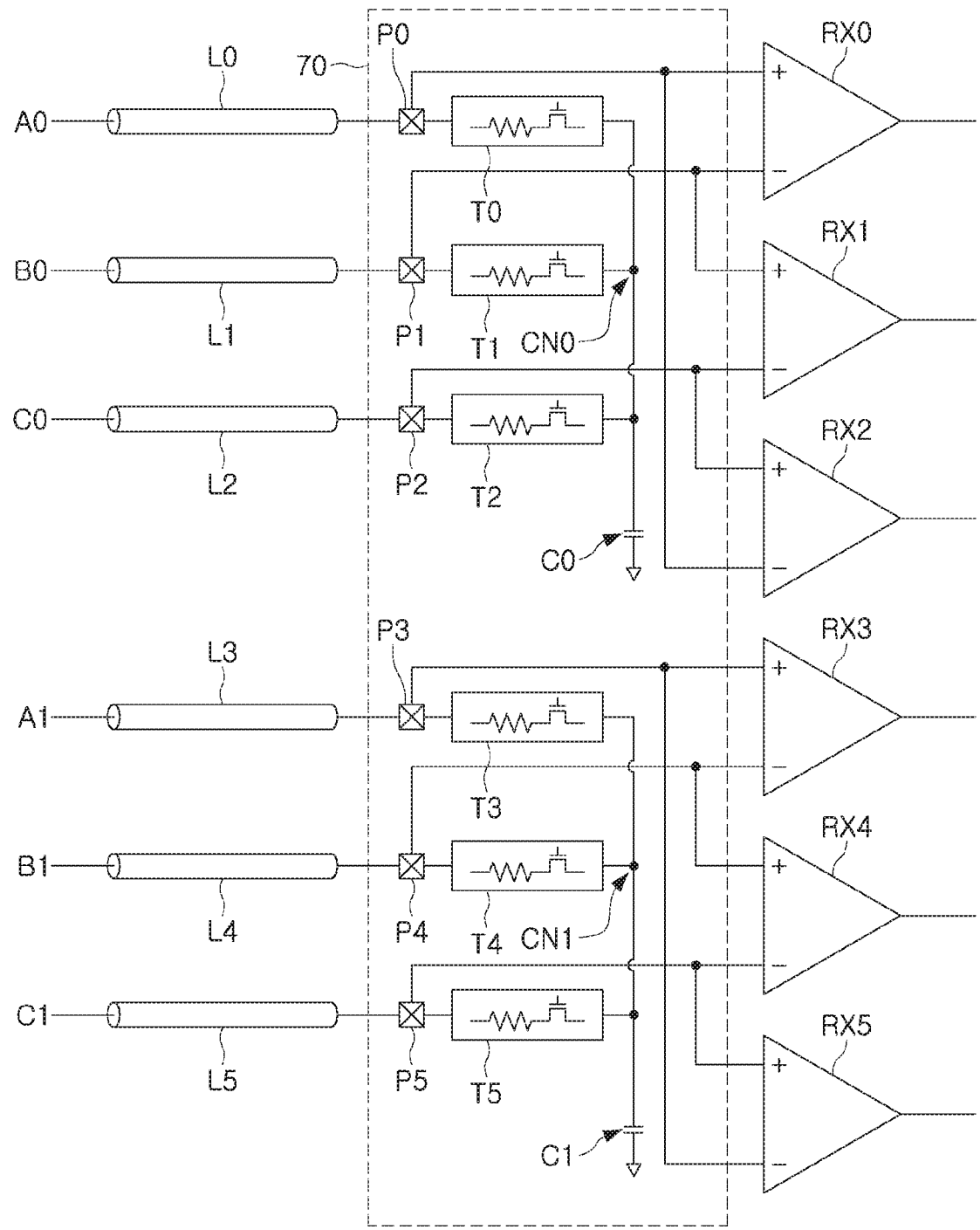
Figure 8:
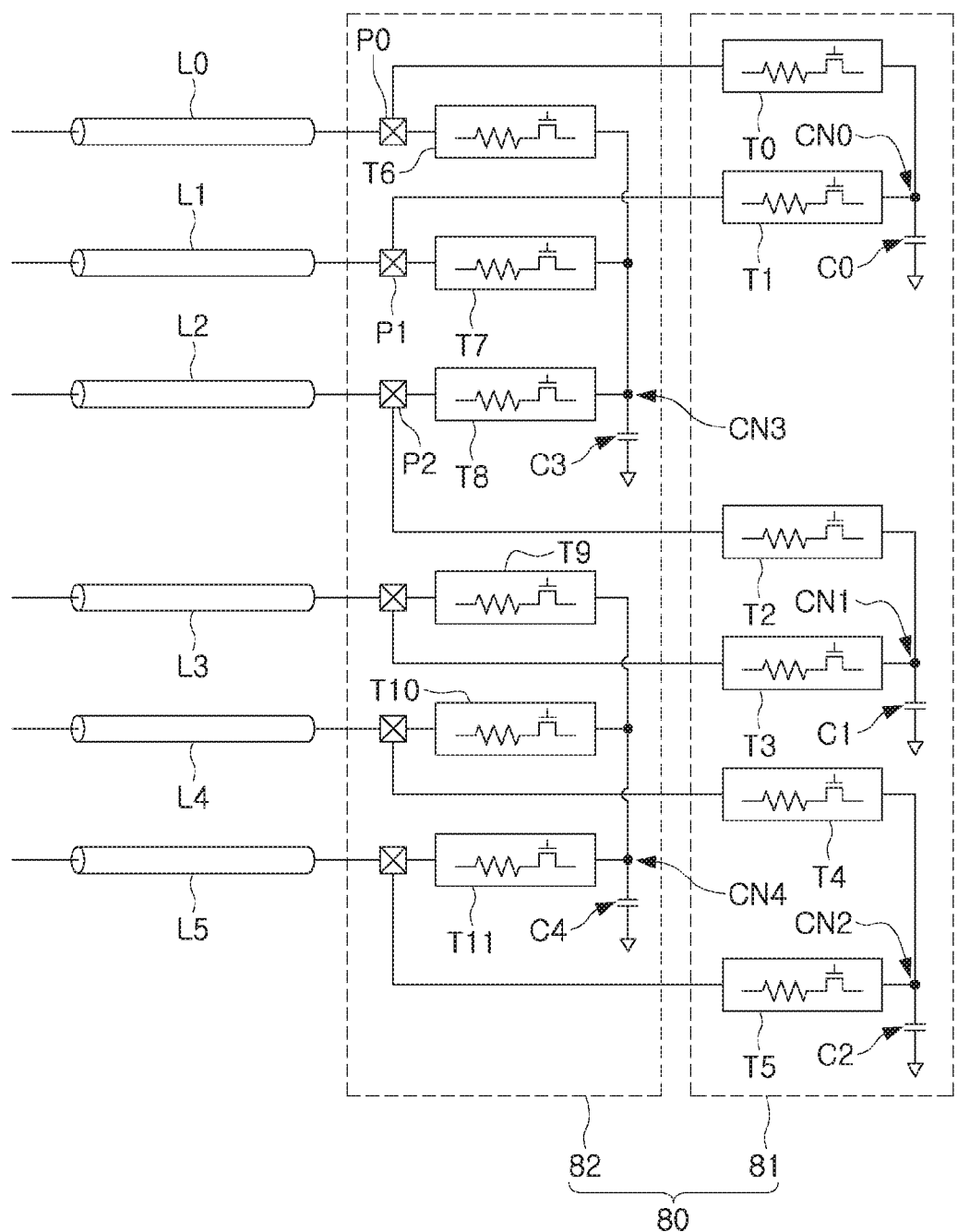

FIGS. 6 through 8 are comparative examples of circuit diagrams illustrating an interface device, according to an example embodiment.

A termination circuit 60, according to an example embodiment illustrated in FIG. 6, may receive data transmitted using differential signaling. Referring to FIG. 6, a signal may be transmitted through first to sixth transmission lines L0 to L5, and the termination circuit 60 may include first to sixth terminals P0 to P5 respectively connected to the first to sixth transmission lines L0 to L5, first to sixth unit circuits T0 to T5 respectively connected to the first to sixth terminals P0 to P5, and first to third common mode capacitors C0 to C2. According to an example embodiment, the number of the first to sixth transmission lines L0 to L5 may be the same as that of the first to sixth unit circuits T0 to T5.

The first to sixth terminals P0 to P5 may be electrically connected to an input terminal of any one of first to third receivers RX0 to RX2. Referring to FIG. 6, the first terminal P0 and the second terminal P1 may be connected to the first receiver RX0. According to an example embodiment, the first receiver RX0 may compare a magnitude of a signal D0P, input through the first terminal P0, with that of a signal D0N, input through the second terminal P1, and may generate data D0, having a high or low logical value, according to the relationship between the magnitudes. For example, in the example embodiment illustrated in FIG. 6, the first receiver RX0 may be connected to a first data lane, constituted by the first and second transmission lines L0 and L1, through the first terminal P0 and the second terminal P1.

In the termination circuit 60 receiving data using the differential signaling, one or more of the first to sixth transmission lines L0 to L5 may be provided as a line for transmitting a clock signal CLK. Referring to FIG. 6, the third receiver RX2 may generate a clock signal CLK based on a signal transmitted through the fifth transmission line L4 and the sixth transmission line L5. A logic circuit, connected to output terminals of the first to third receivers RX0 to RX2, may process data D0 and D1, based on the clock signal CLK.

A termination circuit 70, according to an example embodiment illustrated in FIG. 7, may receive data transmitted using multilevel signaling. Referring to FIG. 7, a signal may be transmitted through first to sixth transmission lines L0 to L5, and the termination circuit 70 may include first to sixth terminals P0 to P5 respectively connected to the first to sixth transmission lines L0 to L5, first to sixth unit circuits T0 to T5 respectively connected to the first to sixth terminals P0 to P5, and first and second common mode capacitors C0 and C1. According to an example embodiment, the number of the first to sixth transmission lines L0 to L5 may be the same as that of the first to sixth unit circuits T0 to T5.

In the termination circuit 70, according to an example embodiment illustrated in FIG. 7, each of the first and second common mode capacitors C0 and C1 may be connected to three of the first to sixth unit circuits T0 to T5, in contrast to the termination circuit 60 of FIG. 6. According to an example embodiment, the first common mode capacitor C0 may be connected to the first to third unit circuits T0 to T2, and the second common mode capacitor C1 may be connected to the fourth to sixth unit circuits T3 to T5. Thus, the first to third transmission lines L0 to L2 may constitute a first data lane, and the fourth to sixth transmission lines L3 to L5 may constitute a second data lane.

A signal, input to each of the first to sixth terminals P0 to P5, may be input to input terminals of at least two of first to sixth receivers RX0 to RX5. As an example, a signal, input to the second terminal P1 through the second transmission line L1, may be input to input terminals of the first receiver RX0 and the second receiver RX1. This may be a characteristic of the multilevel signaling for generating a signal having three or more magnitudes by a combination of signals transmitted through the first to sixth transmission lines L0 to L5. In the example embodiment illustrated in FIG. 7, an output of each of the first to third receivers RX0 to RX2 may be determined according to the relationship between magnitudes of a signal A0 and a signal B0, the relationship between magnitudes of the signal B0 and a signal C0, and the relationship between magnitudes of the signal C0 and the signal A0. Further, a logic circuit connected to the first to sixth receivers RX0 to RX5, may recover data to be transmitted through the first to sixth transmission lines L0 to L5 based on the output of each of the first to sixth receivers RX0 to RX5.

As described above with reference to FIGS. 6 and 7, the termination circuit 60 which receives data using the differential signaling and the termination circuit 70 which receives data using the multilevel signaling may have different structures. Hereinafter, a termination circuit 80 that may support data reception using differential signaling and data reception using multilevel signaling will be described with reference to FIG. 8.

Referring to FIG. 8, the termination circuit 80 may include a first circuit 81 and a second circuit 82. The first circuit 81 may include first to sixth unit circuits T0 to T5 and first to third common mode capacitors C0 to C2. The second circuit 82 may include seventh to twelfth unit circuits T6 to T11 and fourth and fifth common mode capacitors C3 and C4. The first circuit 81 may be a circuit for receiving data transmitted using the differential signaling, and the second circuit 82 may be a circuit for receiving data transmitted using the multilevel signaling.

As illustrated in FIG. 8, in order to receive data transmitted using both differential signaling and multilevel signaling, the number of the first to twelfth unit circuits T0 to T11 included in the termination circuit 80 may be increased, which may lead to an increase in size of the termination circuit 80. Referring to FIG. 8, the twelve unit circuits T0 to T11 may be provided to receive data transmitted through a total of the six transmission lines L0 to L5. Further, as the number of the first to twelfth unit circuits T0 to T11 and the first to fifth common mode capacitors C0 to C4 increases, load viewed from a receiving end may increase. Thus, a data transfer rate of the termination circuit 80 may decrease.

Figure 9:
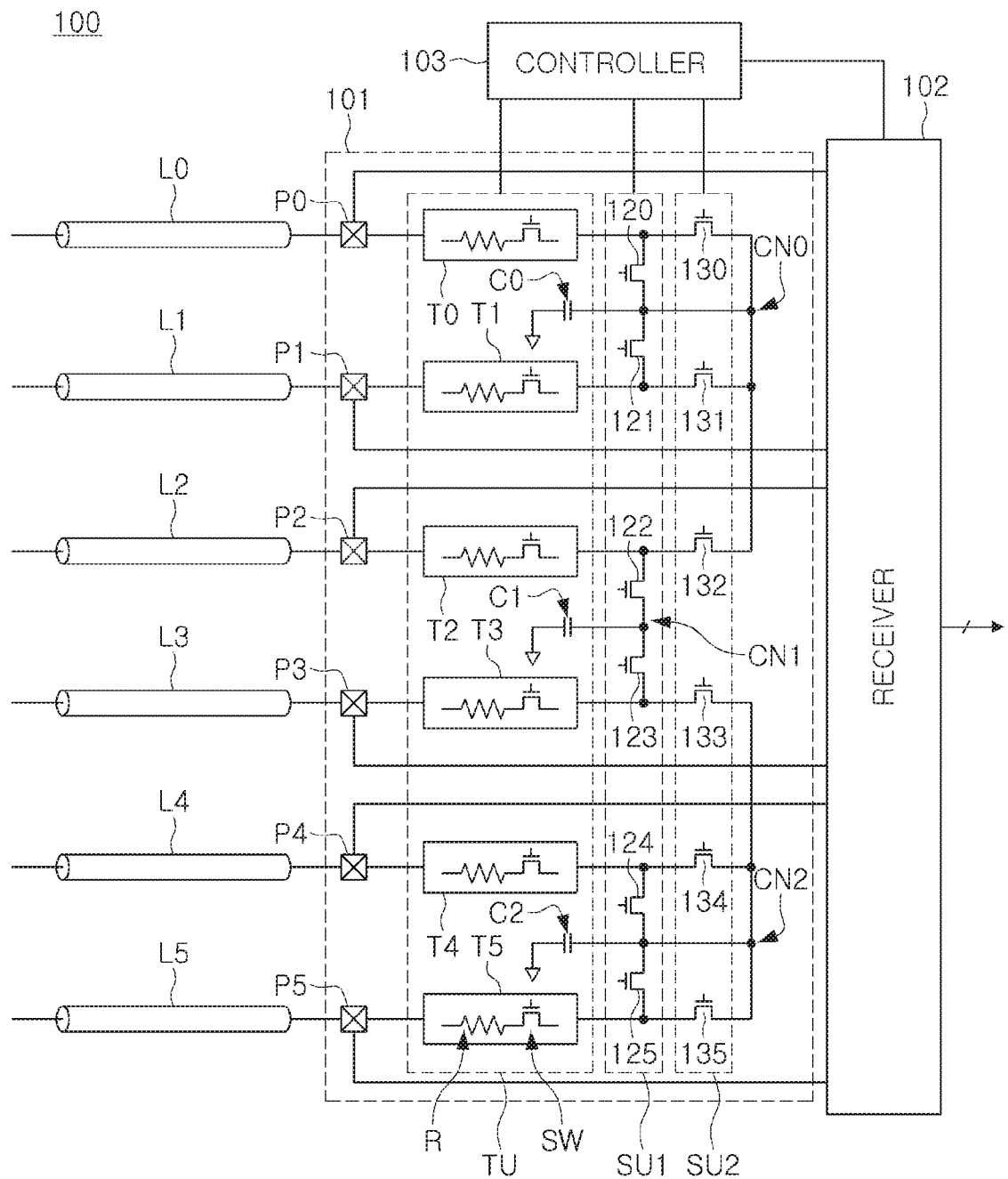
FIGS. 9 through 11 are circuit diagrams illustrating an interface device and operation thereof, according to an example embodiment.
Figure 10:
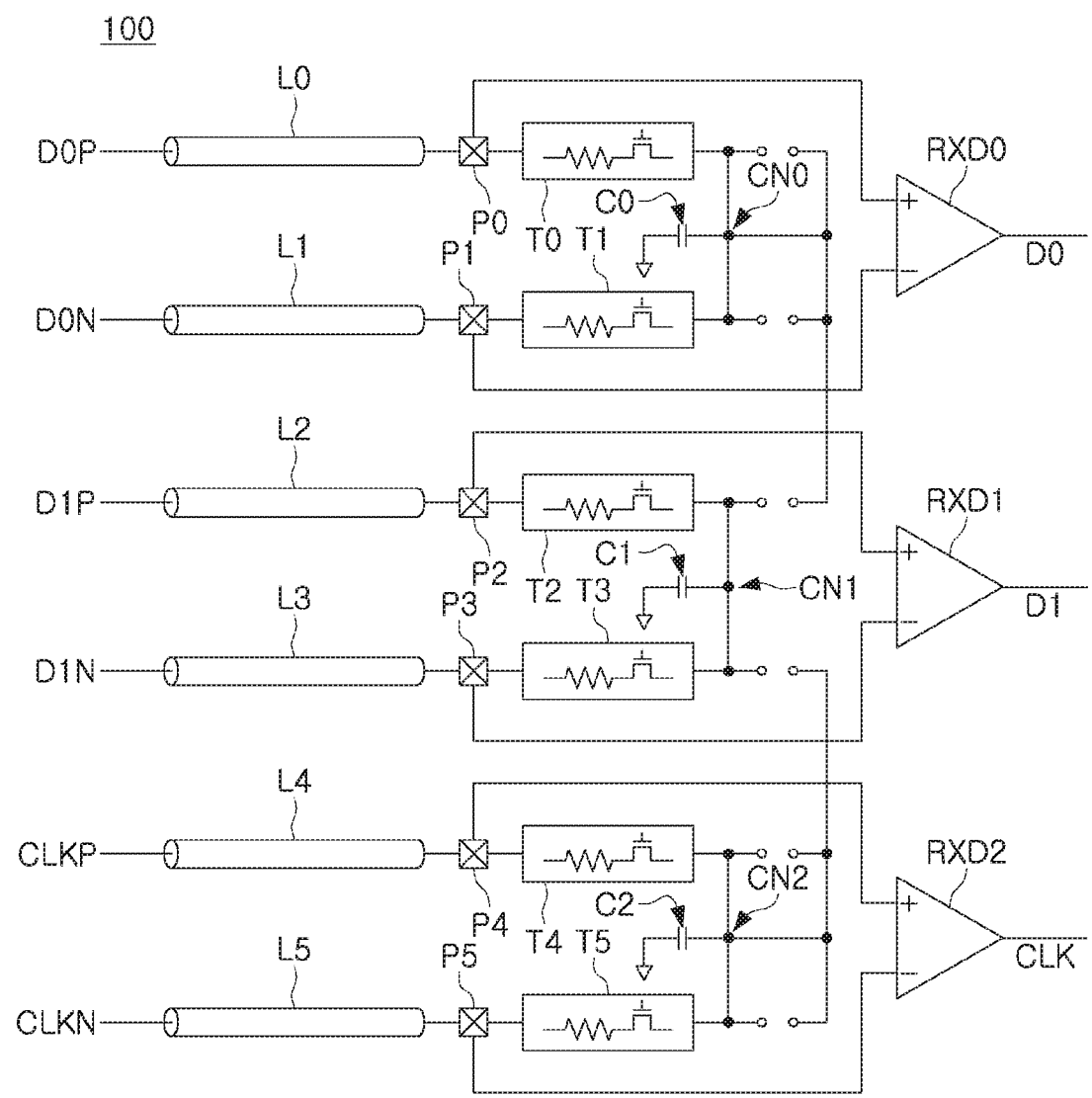
Figure 11:
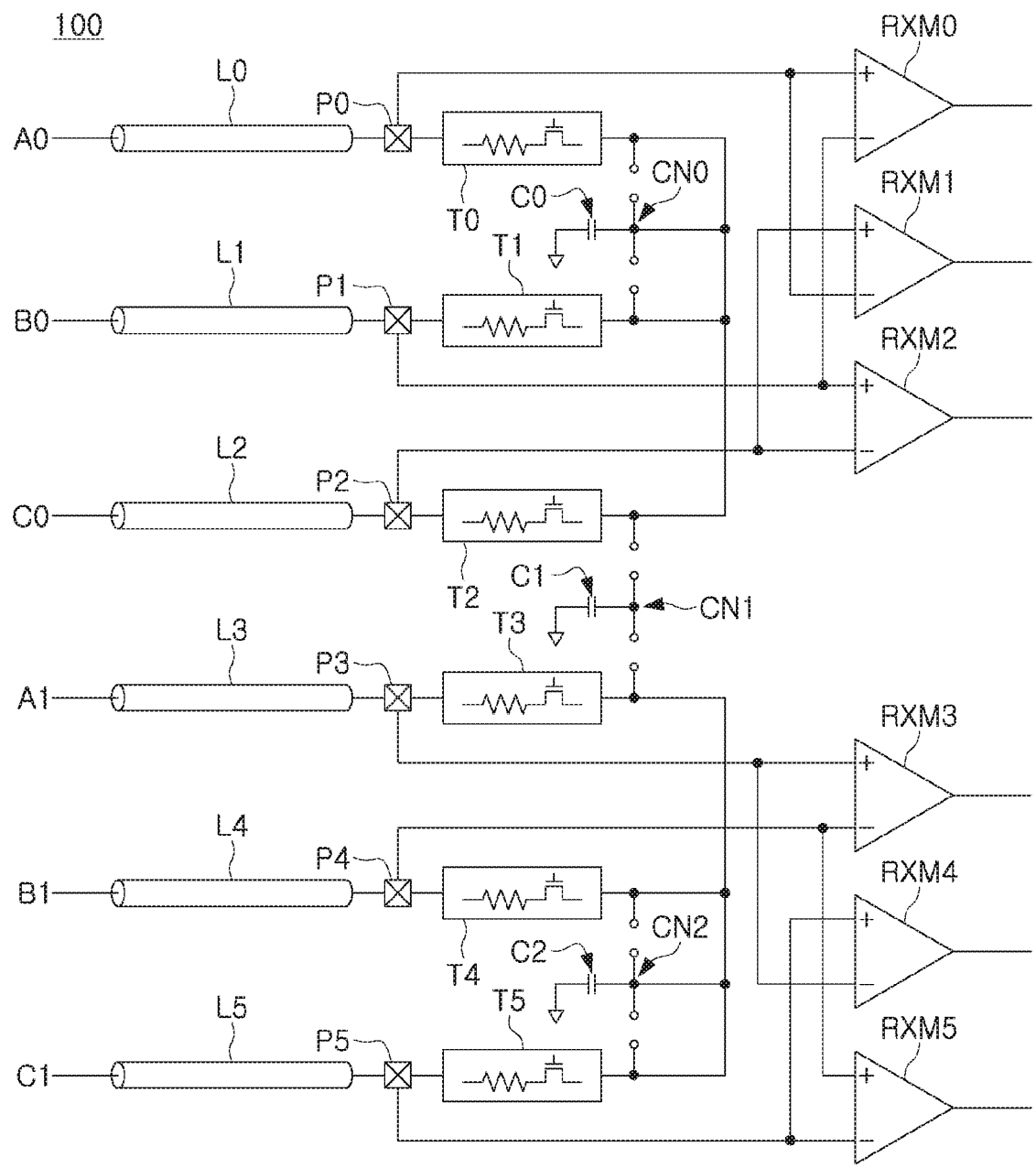

FIGS. 9 through 11 are circuit diagrams illustrating an interface device and operation thereof, according to an example embodiment.

Referring to FIG. 9, an interface device 100, according to an example embodiment, may include a termination circuit 101, a receiver 102, and a controller 103. The interface device 100 may be a circuit configured to receive a signal transmitted through the first to sixth transmission lines L0 to L5 and generate data based on the signal.

The termination circuit 101 may include first to sixth terminals P0 to P5 connected to first to sixth transmission lines L0 to L5, first to sixth termination circuits T0 to T5, first to third common mode capacitors C0 to C2, a first switch unit SU1, and a second switch unit SU2. The first switch unit SU1 may include a plurality of first switch elements 120 to 125, and the second switch unit SU2 may include a plurality of second switch elements 130 to 135. Each of the first to sixth termination circuits T0 to T5 may include a unit resistor R and a unit switch element SW.

Each of the first switch elements 120 to 125 may be connected between an output terminal of any one of the first to sixth termination circuits T0 to T5 and any one of first to third common nodes CN0 to CN2. Each of the second switch elements 130 to 135 may be connected between an output terminal of any one of the first to sixth termination circuits T0 to T5 and any one of first to third common nodes CN0 to CN2. Each of the first to third common mode capacitors C0 to C2 may be connected between any one of the first to third common nodes CN0 to CN2 and a ground node. Referring to the example embodiment of FIG. 9, the first switch elements 120 to 125 and the second switch elements 130 to 135 may form switch pairs between the output terminals of the first to sixth termination circuits T0 to T5 and the first to third common nodes CN0 to CN2.

The receiver 102 may include receivers configured to generate data using a signal input to the first to sixth terminals P0 to P5. The controller 103 may control operations of the receivers included in the receiver 102, and may control the unit switch element SW included in each of the first to sixth termination circuits T0 to T5, and the first switch elements 120 to 125 and the second switch elements 130 to 135.

According to an example embodiment, the controller 103 may turn the unit switch element SW on when a signal is input to the first to sixth terminals P0 to P5 through the first to sixth transmission lines L0 to L5. Further, the controller 103 may turn on one or more of the first switch elements 120 to 125 and the second switch elements 130 to 135, according to a data reception method, and may turn off a remainder thereof.

As an example, the controller 103 may turn the first switch elements 120 to 125 on and turn the second switch elements 130 to 135 off when data is received using differential signaling. The controller 103 may turn the first switch elements 120 to 125 off and turn the second switch elements 130 to 135 on when data is received using multilevel signaling. Hereinafter, a more detailed description will be provided with reference to FIGS. 10 and 11.

FIG. 10 is a circuit diagram illustrating operations of the interface device 100 when configured to receive data using the differential signaling. Referring to FIG. 10, the first and second transmission lines L0 and L1 may constitute a first data lane, and the third and fourth transmission lines L2 and L3 may constitute a second data lane. A clock signal CLK may be transmitted through the fifth and sixth transmission lines L4 and L5.

According to an example embodiment illustrated in FIG. 10, the interface device 100 may be configured to receive data using the differential signaling. Thus, the first switch elements 120 to 125 may be turned on, and the second switch elements 130 to 135 may be turned off. Thus, in the example embodiment illustrated in FIG. 10, the first switch elements 120 to 125 are illustrated as closed circuits, and the second switch elements 130 to 135 are illustrated as open circuits.

All of the second switch elements 130 to 135 may be turned off, and thus each of the first to third common mode capacitors C0 to C2 may be connected to two of the first to sixth unit circuits T0 to T5 through each of the first to third common nodes CN0 to CN2. As an example, the first common mode capacitor C0 may be connected to the first and second unit circuits T0 and T1 through the first common node CN0. The first and second unit circuits T0 and T1 and the first common mode capacitor C0 may perform impedance matching for a signal transmitted to the first terminal P0 and the second terminal P1.

In the example embodiment illustrated in FIG. 10, a signal, input to the respective first to sixth terminals P0 to P5, may be converted into data by first to third differential receivers RXD0 to RXD2. As an example, a signal transmitted through the first and second transmission lines L0 and L1 may be input to the first differential receiver RXD0, and a signal transmitted through the third and fourth transmission lines L2 and L3 may be input to the second differential receiver RXD1. In addition, a signal transmitted through the fifth and sixth transmission lines L4 and L5 may be input to the third differential receiver RXD2, and the third differential receiver RXD2 may output a clock signal CLK.

Referring to FIG. 10, when the interface device 100 according to an example embodiment receives data using the differential signaling, loads connected to a non-inverting input terminal and an inverting input terminal of each of the first to third differential receivers RXD0 to RXD2 may be symmetrical to each other. As an example, the non-inverting input terminal of the second differential receiver RXD1 may be connected to the third unit circuit T2 and the second common mode capacitor C1, and the inverting input terminal of the second differential receiver RXD1 may be connected to the fourth unit circuit T3 and the second common mode capacitor C1 through the fourth terminal P3. The first to sixth unit circuits T0 to T5 may have substantially the same resistance, for example, a resistance of 50 ohm ($\Omega$), and thus the loads connected to the non-inverting input terminal and the inverting input terminal of each of the first to third differential receivers RXD0 to RXD2 may be symmetrical to each other. Thus, the interface device 100, according to an example embodiment, may significantly reduce common mode noise when receiving data using the differential signaling.

FIG. 11 is a circuit diagram illustrating operations of the interface device 100 when configured to receive data using the multilevel signaling. Referring to FIG. 11, the first to third transmission lines L0 to L2 may constitute a first data lane, and the fourth to sixth transmission lines L3 to L5 may constitute a second data lane. A clock signal may be transmitted in an embedded form through the first data lane or the second data lane, and may be recovered by a clock recovery circuit connected to the interface device 100.

According to an example embodiment illustrated in FIG. 11, the interface device 100 may be configured to receive data using the multilevel signaling, and thus the first switch elements 120 to 125 may be turned off, and the second switch elements 130 to 135 may be turned on. Thus, in the example embodiment illustrated in FIG. 11, the first switch elements 120 to 125 are illustrated as open circuits, and the second switch elements 130 to 135 are illustrated as closed circuits.

All of the first switch elements 120 to 125 may be turned off and all of the second switch elements 130 to 135 may be turned on, and thus each of the first to third common mode capacitors C0 to C2 may be connected to three of the first to sixth unit circuits T0 to T5 through each of the first to third common nodes CN0 to CN2. The second common mode capacitor C1 and the second common node CN1 may not be connected to the first to sixth unit circuits T0 to T5.

Each of first to sixth multilevel receivers RXM0 to RXM5 may be connected to one or more of the first to sixth terminals P0 to P5. As an example, each of the first to third multilevel receivers RXM0 to RXM2 may calculate a difference among signals A0, B0, and C0 transmitted through the first to third transmission lines L0 to L2, constituting the first data lane. The first multilevel receiver RXM0 may calculate a difference between the signals A0 and B0, the second multilevel receiver RXM1 may calculate a difference between the signals B0 and C0, and the third multilevel receiver RXM2 may calculate a difference between the signals C0 and A0. A logic circuit, connected to output terminals of the first to sixth multilevel receivers RXM0 to RXM5, may generate data based on a difference among the signals A0, B0, and C0 and signals A1, B1, and C1 transmitted through the respective first to sixth transmission lines L0 to L5.

Referring to FIG. 11, when receiving data using the multilevel signaling, the interface device 100 according to an example embodiment may significantly reduce a difference between a path from the non-inverting input terminal of each of the first to sixth multilevel receivers RXM0 to RXM5 to the unit resistor and a path from the inverting input terminal of each of first to sixth multilevel receivers RXM0 to RXM5 to the unit resistor. Thus, the interface device 100 may significantly reduce skew among the first to sixth transmission lines L0 to L5 that may occur when data is received using the multilevel signaling.

By designing the interface device 100 in accordance with the example embodiments illustrated in FIGS. 9 through 11, both data transmitted using the differential signaling and data transmitted using the multilevel signaling may be received by a single interface device 100. Simultaneously, the termination circuit 101 may be implemented without an increase in the number of the first to sixth unit circuits T0 to T5 and the first to third common mode capacitors C0 to C2, so as to prevent an increase in load viewed from a receiving end, while significantly reducing an increase in size of the interface device 100, thus enabling high-speed data reception.

Figure 12:
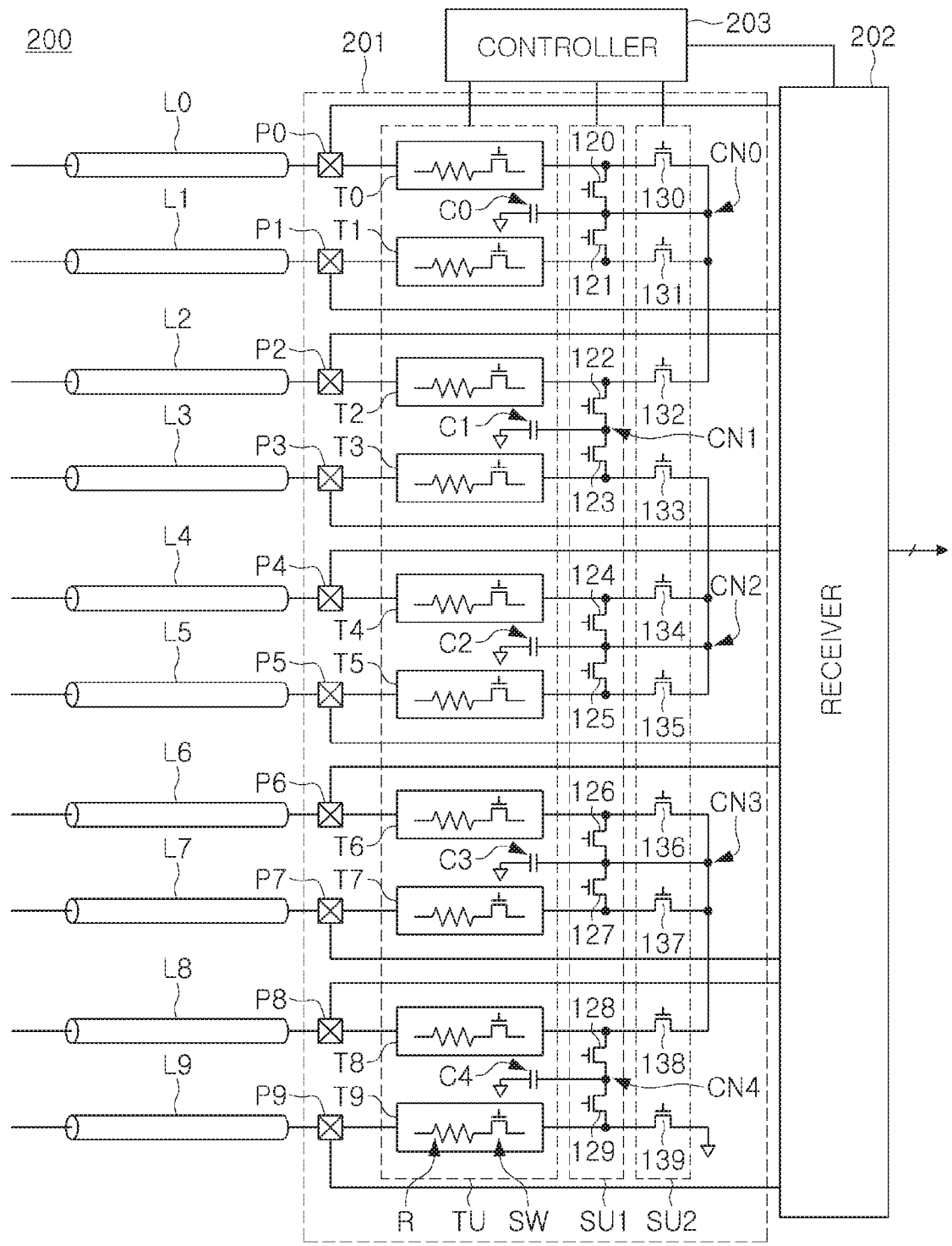
FIGS. 12 through 14 are circuit diagrams illustrating an interface device and operation thereof, according to an example embodiment.
Figure 13:
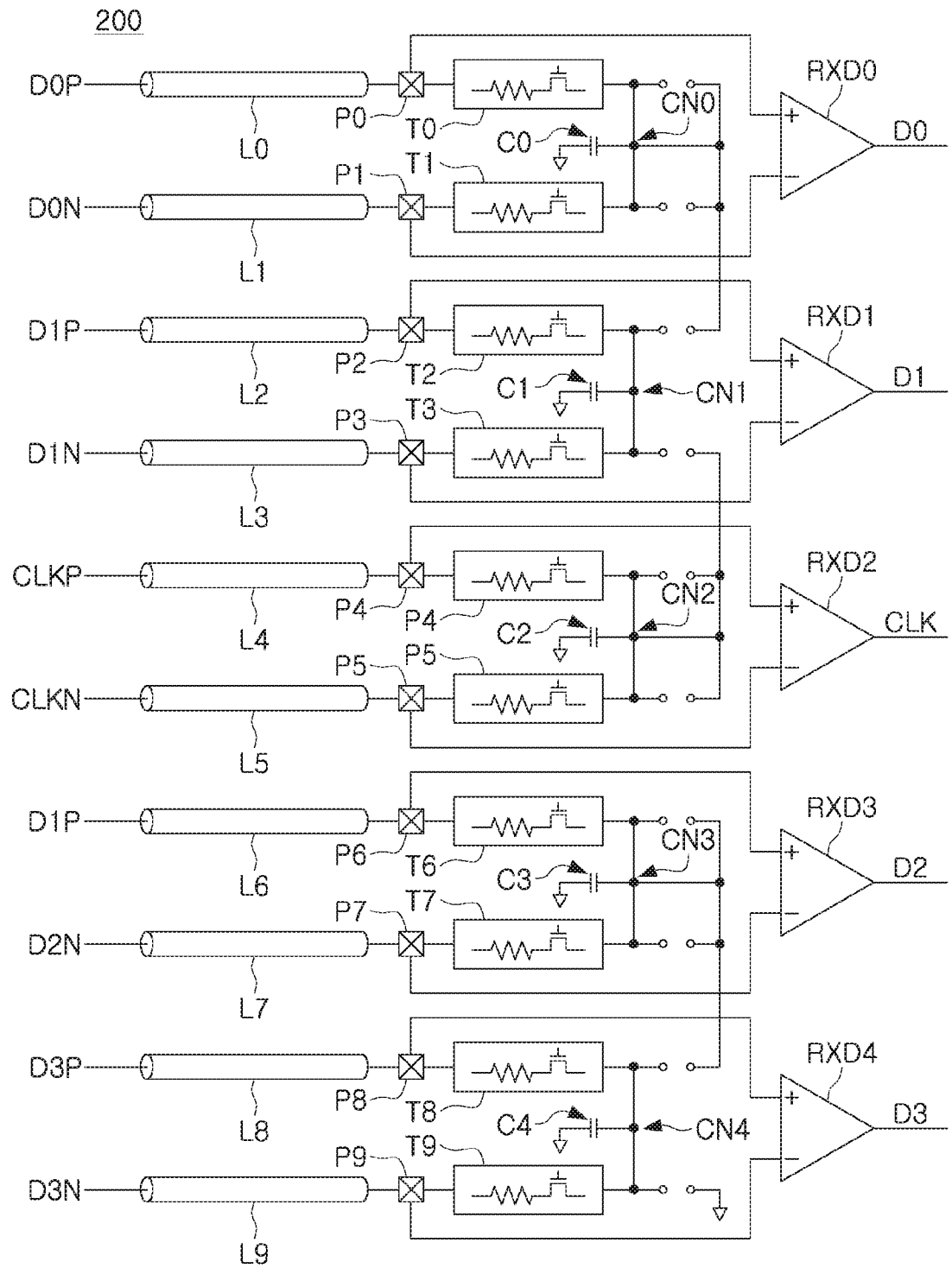
Figure 14:
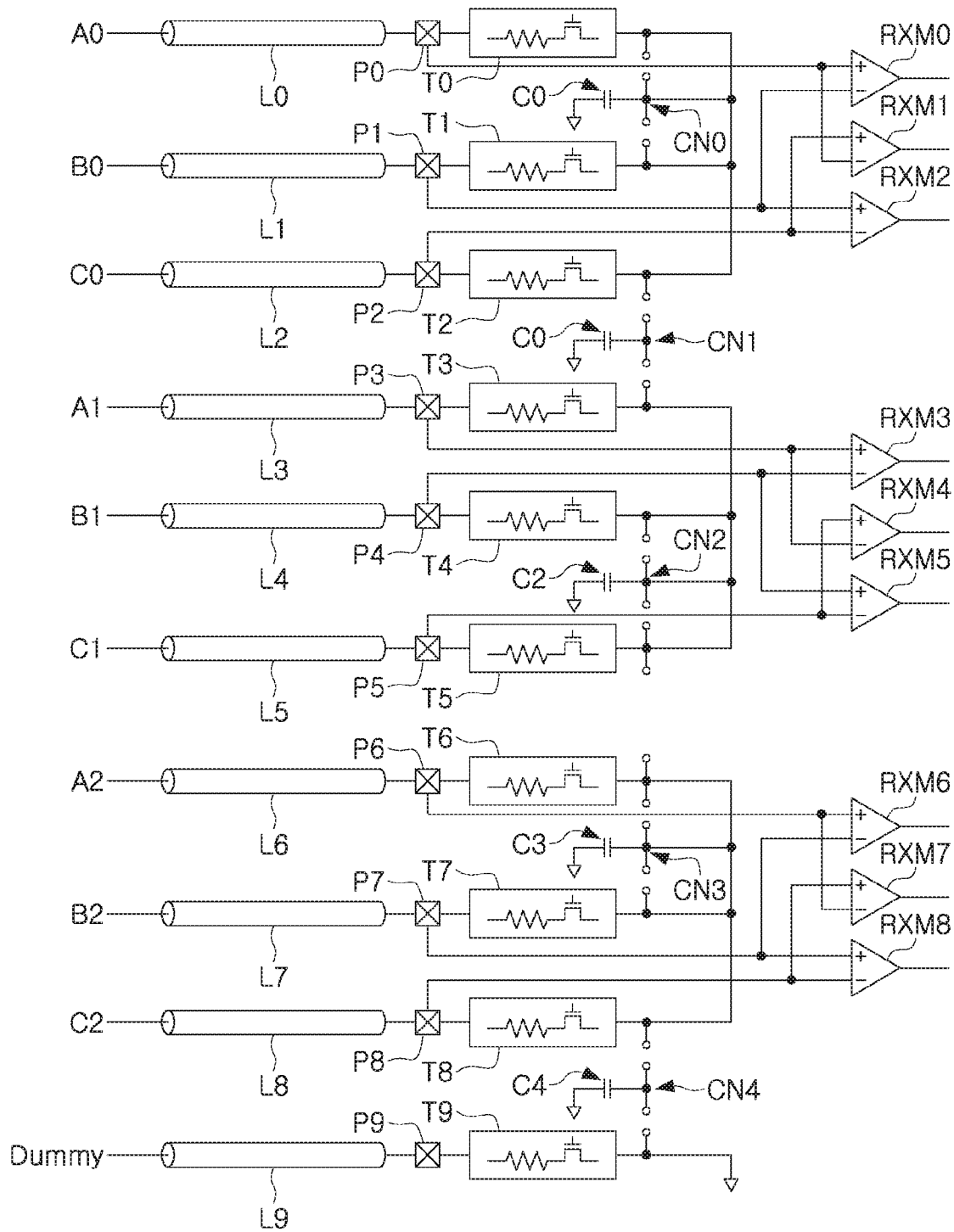

FIGS. 12 through 14 are circuit diagrams illustrating an interface device and operation thereof, according to an example embodiment.

Referring to FIG. 12, an interface device 200, according to an example embodiment, may include a termination circuit 201 connected to first to tenth transmission lines L0 to L9, a receiver 202, and a controller 203. The termination circuit 201 may perform impedance matching for a signal transmitted through the first to tenth transmission lines L0 to L9. The receiver 202 may generate data based on signals for which the impedance matching has been performed by the termination circuit 201, and the controller 203 may control operations of the termination circuit 201 and the receiver 202.

The termination circuit 201 may include a unit circuit TU, a first switch unit SU1, a second switch unit SU2, and first to fifth common mode capacitors C0 to C4. The unit circuit TU may include first to tenth unit circuits T0 to T9, each of which may include a unit resistor R and a unit switch element SW connected to each other in series. According to an example embodiment, the sum of turn-on resistance values of the unit resistor R and the unit switch element SW may be about 50 ohm (Ω).

Input terminals of the first to tenth unit circuits T0 to T9 may be connected to first to tenth terminals P0 to P9, and output terminals of the first to tenth unit circuits T0 to T9 may be connected to the first switch unit SU1 and the second switch unit SU2. The first switch unit SU1 may include a plurality of first switch elements 220 to 229, and the second switch unit SU2 may include a plurality of second switch elements 230 to 239. The first switch elements 220 to 229 and the second switch elements 230 to 239 may be connected between the output terminals of the first to tenth unit circuits T0 to T9 and first to fifth common nodes CN0 to CN4. The first to fifth common mode capacitors C0 to C4 may be connected between the first to fifth common nodes CN0 to CN4 and ground nodes. The controller 203 may control the first switch elements 220 to 229 or the second switch elements 230 to 239 to be turned on or off.

The unit switch element SW included in each of the first to tenth unit circuits T0 to T9 may be turned on when a signal is transmitted through the first to tenth transmission lines L0 to L9. The first switch elements 220 to 229 may be turned on when data is received using differential signaling, and may be turned off when data is received using multilevel signaling. The second switch elements 230 to 239 may be turned off when data is received using the differential signaling, and may be turned on when data is received using the multilevel signaling.

By designing the termination circuit 201 as illustrated in FIG. 12, data transmitted using the differential signaling or the multilevel signaling may be received by a single interface device 200. Hereinafter, operations of the interface device 200 will be detailed with reference to FIGS. 13 and 14.

FIG. 13 is a circuit diagram illustrating operations of the interface device 200 when configured to receive data using the differential signaling. Referring to FIG. 13, when data is received using the differential signaling, the first switch elements 220 to 229 may be turned on to operate as closed circuits, and the second switch elements 230 to 239 may be turned off to operate as open circuits. Thus, an adjacent pair of the first to tenth unit circuits T0 to T9 may be connected to any one of the first to fifth common nodes CN0 to CN4 to share any one of the first to fifth common mode capacitors C0 to C4.

According to an example embodiment, each of signals D0P and D0N transmitted through the first transmission line L0 and the second transmission line L1 may be input to a first differential receiver RXD0 connected to the first terminal P0 and the second terminal P1. The first differential receiver RXD0 may generate first data D0, according to the relationship between magnitudes of the signals D0P and D0N transmitted through the first transmission line L0 and the second transmission line L1. When data is communicated using the differential signaling, one or more of the first to tenth transmission lines L0 to L9, for example, the fifth and sixth transmission lines L4 and L5, may be provided to transmit a clock signal CLK.

As in the example embodiments illustrated in FIGS. 12 and 13, when the interface device 200 receives a signal using the differential signaling, loads connected to a non-inverting input terminal and an inverting input terminal of each of the first differential receiver RXD0 and second to fifth differential receivers RXD1 to RXD4 may be substantially symmetrical to each other. Thus, a signal-to-noise ratio (SNR) of the interface device 200 may be reduced by canceling common mode noise.

FIG. 14 is a circuit diagram illustrating operations of the interface device 200 when configured to receive data using the multilevel signaling. Referring to FIG. 14, when data is received using the multilevel signaling, the first switch elements 220 to 229 may be turned off to operate as open circuits, and the second switch elements 230 to 239 may be turned on to operate as closed circuits. Thus, three adjacent circuits of the first to tenth unit circuits T0 to T9 may be connected to any one of the first to fifth common nodes CN0 to CN4 to share any one of the first to fifth common mode capacitors C0 to C4.

According to an example embodiment, each of signals A1, B1, and C1 transmitted through the fourth to sixth transmission lines L3 to L5 may be input to fourth to sixth multilevel receivers RXM3 to RXM5 connected to a portion of the fourth to sixth terminals P3 to P5. The fourth multilevel receiver RXM3 may calculate a difference between the signal A1 transmitted through the fourth transmission line L3 and the signal B1 transmitted through the fifth transmission line L4. The fifth multilevel receiver RXM4 may calculate a difference between the signal C1 transmitted through the sixth transmission line L5 and the signal A1 transmitted through the fourth transmission line L3. The sixth multilevel receiver RXM5 may calculate a difference between the signal B1 transmitted through the fifth transmission line L4 and the signal C1 transmitted through the sixth transmission line L5. A logic circuit, connected to output terminals of the first to sixth multilevel receivers RXM0 to RXM5 and seventh to ninth multilevel receivers RXM6 to RXM8, may generate data based on outputs of the first to ninth multilevel receivers RXM0 to RXM8.

According to an example embodiment illustrated in FIG. 14, the total number of the first to tenth transmission lines L0 to L9 is 10, and data may be transmitted through three data lanes DL0 to DL2 constituted by nine of the first to tenth transmission lines L0 to L9, for example, the first to ninth transmission lines L0 to L8, using the multilevel signaling. Thus, at least one among the first to tenth transmission lines L0 to L9 may be a dummy line, for example, the tenth transmission line L9. The unit switch element SW of the tenth unit circuit T9, connected to the dummy line, may be turned off. The first switch element 229 and the second switch elements 239, connected to the dummy line, may also be turned off. For example, according to the number of the first to tenth transmission lines L0 to L9, even when data is received using the multilevel signaling, the second switch element 239, connected to the dummy line, may be turned off.

Figure 15:
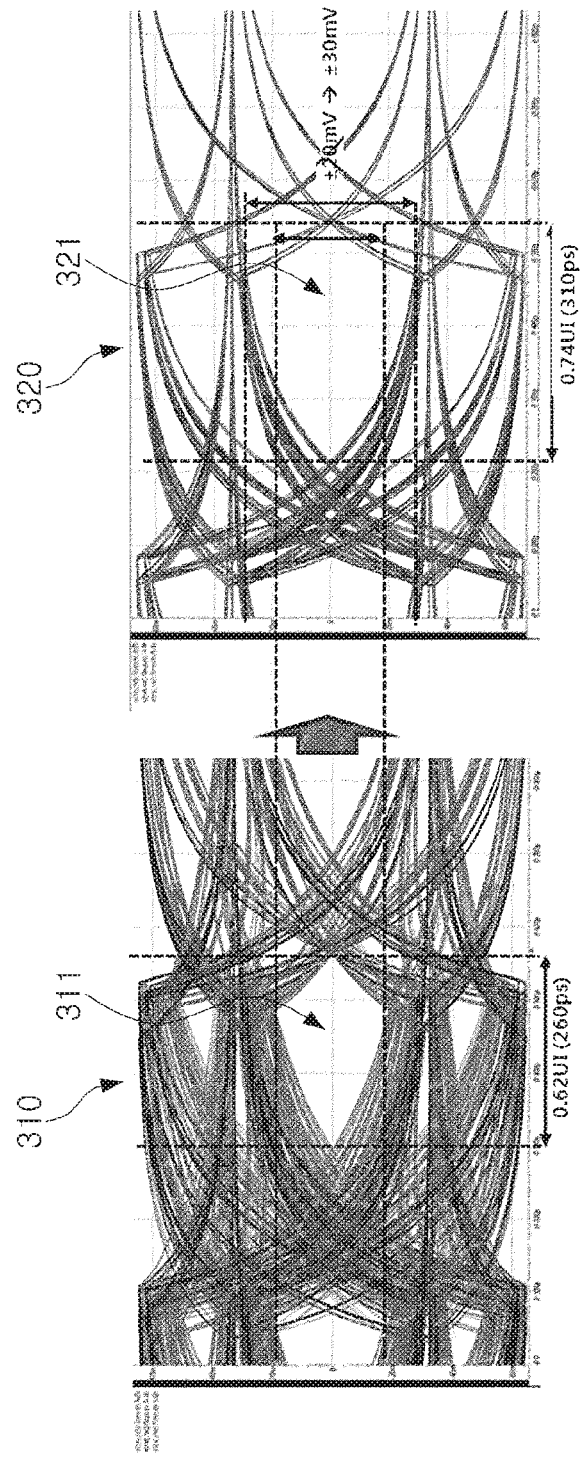
FIG. 15 is a graph illustrating a simulation result of a signal output by an interface device, according to an example embodiment.

FIG. 15 is a graph illustrating a simulation result of a signal output by an interface device, according to an example embodiment.

FIG. 15 illustrates an eye diagram representing a performance improvement effect exhibited when an interface device, according to an example embodiment, receives data using multilevel signaling. As illustrated in FIG. 15, a first graph 310 represents a simulation result obtained when an interface device including the termination circuit 80 according to the example embodiment illustrated in FIG. 8 receives data using the multilevel signaling. A second graph 320 represents a simulation result obtained when the interface device 100 according to the example embodiment illustrated in FIG. 9 receives data using the multilevel signaling. In both the first graph 310 and the second graph 320, bit transfer rate may be 2.4 gigabits per second (Gbps). Thus, one interval may be about 417 picoseconds (ps).

An eye pattern, shown in the eye diagram, may be determined by jitter components contained in signals received by the interface devices, and according to an example embodiment, the eye pattern may be determined by intersymbol interference. An eye opening 311, shown in the first graph 310, may have ±20 millivolts (mV) during a 0.62 unit interval, whereas an eye opening 321, shown in the second graph 320, may have ±30 mV during a 0.74 unit interval. For example, the eye opening 321, shown in the second graph 320, may have a 20% increased width and a 30% increased level, as compared to the eye opening 311 shown in the first graph 310. Thus, the interface device 100 as in the example embodiments, may be fabricated, thereby ensuring better data reception qualities.

As set forth above, according to example embodiments, a connection structure of unit circuits included in a termination circuit and a receiver may be changed according to communication standards for data transmission. Thus, data transmitted according to different communication standards may be received through a single termination circuit and a single interface device, and noise and interline skew that may occur in data reception may be significantly reduced.

While example embodiments have been shown and described above, it will be apparent to those skilled in the art that modifications and variations could be made without departing from the scope of the present inventive concept, as defined by the appended claims.

What is claimed is:

1. A termination circuit comprising:
   a plurality of terminals, each of the plurality of terminals being configured to receive a corresponding signal;
   a plurality of unit circuits respectively connected to the plurality of terminals, the plurality of unit circuits each including a unit resistor and a unit switch element connected to each other in series, and the plurality of unit circuits comprising a first unit circuit, a second unit circuit and a third unit circuit;
   a plurality of common mode capacitors;
   a plurality of first switch elements respectively connected between each of the plurality of unit circuits and a first corresponding common mode capacitor of the plurality of common mode capacitors, each of the plurality of first switch elements being configured to turn on when the corresponding signal is received in a first mode; and
   a plurality of second switch elements respectively connected between each of the plurality of unit circuits and a second corresponding common mode capacitor of the plurality of common mode capacitors, the plurality of second switch elements being configured to turn on when the corresponding signal is received in a second mode different from the first mode, wherein a first capacitor of the plurality of common mode capacitors is connected to the first unit circuit and the second unit circuit, as the first corresponding common mode capacitor, while each of the plurality of first switch elements is turned on, wherein the first capacitor is isolated from the third unit circuit while each of the plurality of first switch elements is turned on, wherein the first capacitor is connected to the first unit circuit, the second unit circuit and the third unit circuit, as the second corresponding common mode capacitor, while each of the plurality of second switch elements is turned on, and wherein a second capacitor of the plurality of common mode capacitors is connected to the third unit circuit, as the first corresponding common mode capacitor, while each of the plurality of first switch elements is turned on.

2. The termination circuit of claim 1, wherein the unit switch element is configured to turn on and turn off according to whether the corresponding signal is received at the plurality of terminals, regardless of the first mode and the second mode.

3. The termination circuit of claim 1, wherein each of the plurality of first switch elements has a first input terminal and a first output terminal, wherein each of the plurality of second switch elements has a second input terminal and a second output terminal, wherein the first input terminal of each of the plurality of first switch elements and the second input terminal of each of the plurality of second switch elements are connected to a corresponding unit circuit of the plurality of unit circuits, wherein the first output terminal of each of the plurality of first switch elements is connected to the first corresponding common mode capacitor, and wherein the second output terminal of each of the plurality of first switch elements is connected to the second corresponding common mode capacitor.

4. The termination circuit of claim 1, wherein the first corresponding common mode capacitor is shared by two adjacent unit circuits of the plurality of unit circuits while the corresponding signal is received in the first mode.

5. The termination circuit of claim 1, wherein the second corresponding common mode capacitor is shared by three adjacent unit circuits of the plurality of unit circuits while the corresponding signal is received in the second mode.

6. The termination circuit of claim 1, wherein one or more of the plurality of terminals receives a clock signal while the corresponding signal is received in the first mode.

7. The termination circuit of claim 1, wherein the first mode is a mode to receive the corresponding signal according to a mobile industry processor interface (MIPI) D-Phy interface.

8. The termination circuit of claim 1, wherein the second mode is a mode to receive the corresponding signal according to a MIPI C-Phy interface.

9. The termination circuit of claim 1, wherein the first corresponding common mode capacitor and the second corresponding common mode capacitor corresponding to at least one among the plurality of unit circuits are capacitors different from each other.

10. The termination circuit of claim 1, wherein at least one among the plurality of unit circuits is configured to operate as a dummy circuit while the corresponding signal is received in the second mode.

11. A termination circuit comprising:
a plurality of unit circuits having input terminals respectively connected to a plurality of terminals;
a plurality of common mode capacitors respectively connected between a plurality of common nodes and a ground; and
a switch unit including a plurality of switch pairs which respectively connect output terminals of the plurality of unit circuits to corresponding common nodes of the plurality of common nodes, each of the plurality of switch pairs including a first switch element and a second switch element,
wherein the first switch element included in a first switch pair among the plurality of switch pairs corresponds to a first common node and the second switch element in the first switch pair also corresponds to the first common node, and
wherein the first switch element included in a second switch pair among the plurality of switch pairs corresponds to a second common node and the second switch element in the second switch pair corresponds to the first common node.

12. The termination circuit of claim 11, wherein the second switch element of each of the plurality of switch pairs is turned off while the first switch element of each of the plurality of switch pairs is turned on, and
wherein when the first switch element of each of the plurality of switch pairs is turned off while the second switch element of each of the plurality of switch pairs is turned on.

13. The termination circuit of claim 12, wherein the first switch element of each of the plurality of switch pairs is configured to turn on while a signal is received through the plurality of terminals in a first mode, and
wherein the second switch element of each of the plurality of switch pairs is configured to turn on while the signal is received through the plurality of terminals in a second mode different from the first mode.

14. The termination circuit of claim 13, wherein the first mode corresponds to a MIPI D-Phy interface, and
wherein the second mode corresponds to a MIPI C-Phy interface.

15. The termination circuit of claim 13, wherein the first switch element of each of first switch pairs which connected to one of the plurality of common mode capacitors is connected to a single receiver while the signal is received in the first mode.

16. The termination circuit of claim 13, wherein each of a second group of second switch elements connected to one of the plurality of common mode capacitors is connected to a plurality of receivers while the signal is received in the second mode.

17. The termination circuit of claim 11, wherein a first number of first switch elements connected to each of the plurality of common mode capacitors through the plurality of common nodes, is less than a second number of second switch elements connected to each of the plurality of common mode capacitors through the plurality of common nodes.

18. An interface device comprising:
- a plurality of receivers respectively configured to generate data corresponding to a signal which is input to a corresponding terminal of a plurality of terminals;
- a plurality of unit circuits each including a unit resistor and a unit switch element connected to each other in series, the plurality of unit circuits being respectively connected to the plurality of terminals, and the plurality of unit circuits comprising a first unit circuit, a second unit circuit and a third unit circuit;
- a plurality of common mode capacitors respectively connected to the plurality of unit circuits through corresponding first switch elements of a plurality of first switch elements and corresponding second switch elements of a plurality of second switch elements; and
- a controller configured to turn the plurality of first switch elements on in response to the signal being received in a first mode and turn the plurality of second switch elements on in response to the signal being received in a second mode,
- wherein a first capacitor of the plurality of common mode capacitors is connected to the first unit circuit and the second unit circuit by two of the plurality of first switch elements in response to the signal being received in the first mode,
- wherein the first capacitor is connected to the first unit circuit, the second unit circuit and the third unit circuit by three of the plurality of second switch elements in response to the signal being received in the second mode, and
- wherein the third unit circuit is isolated from the first capacitor and connected to a second capacitor of the plurality of common mode capacitors in response to the signal being received in the first mode.

19. The interface device of claim 18, wherein the plurality of receivers are further configured to generate the data by processing the signal received in the first mode as a differential signal and processing the signal received in the second mode as a multi-level signal.

20. The interface device of claim 18, wherein a first group of the plurality of first switch elements and a second group of the plurality of second switch elements which are connected to at least one among the plurality of unit circuits are connected to different common mode capacitors.

* * * * *